(12) United States Patent
Langlois et al.

(10) Patent No.: US 11,993,011 B1
(45) Date of Patent: May 28, 2024

(54) PLASMA MICRONOZZLE ADAPTER

(71) Applicant: National Technology & Engineering Solutions of Sandia, LLC, Albuquerque, NM (US)

(72) Inventors: Eric Langlois, Albuquerque, NM (US); Judith Maria Lavin, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 616 days.

(21) Appl. No.: 17/152,942

(22) Filed: Jan. 20, 2021

Related U.S. Application Data

(60) Provisional application No. 62/969,249, filed on Feb. 3, 2020.

(51) Int. Cl.
*B29C 64/209* (2017.01)
*B33Y 30/00* (2015.01)
*B33Y 80/00* (2015.01)
*B81C 1/00* (2006.01)
*H01J 37/04* (2006.01)

(52) U.S. Cl.
CPC ........ *B29C 64/209* (2017.08); *B81C 1/00373* (2013.01); *H01J 37/04* (2013.01); *B33Y 30/00* (2014.12); *B33Y 80/00* (2014.12); *B81C 2201/0188* (2013.01); *H01J 2237/31732* (2013.01)

(58) Field of Classification Search
CPC .............. B29C 64/209; B81C 1/00373; B81C 2201/0188; H01J 37/04; H01J 2237/31732; B33Y 30/00; B33Y 80/00
See application file for complete search history.

(56) References Cited

U.S. PATENT DOCUMENTS 10,357,920 B2 * 7/2019 Mukhopadhyay ...... B22F 12/10
10,730,239 B1 * 8/2020 Glukhoy ............... B29C 64/245
(Continued)

OTHER PUBLICATIONS

Gandhiraman, R. P. et al., "Plasma Jet printing of Electronic Materials on Flexible and Nonconformal Objects," ACS Appl. Mater. Interfaces (2014) 6:20860-20867.
(Continued)

*Primary Examiner* — David A Vanore
(74) *Attorney, Agent, or Firm* — Mark A. Dodd

(57) ABSTRACT

Plasma micro nozzle adapters having various configurations and operating principles are disclosed. The plasma micro nozzle adapter is employed with a commercial plasma jet printer to produce smaller printed features than those possible with the original plasma jet printer. In a first class of embodiments, the plasma micro nozzle adapter narrows a plasma jet using electrostatic or magnetostatic lensing, permitting the printing of ceramic, metallic, dielectric, or plastic features with line widths of 10 μm or less. In a second class of embodiments, the plasma micro nozzle adapter narrows the plasma jet using a gas sheath. By adjusting the flow rate or pressure of the gas used to form the gas sheath, the cross-sectional shape of the plasma jet may form, for example, an ellipse, thereby controlling the width of the printed feature. A third class of embodiments employs both electrostatic (or magnetostatic) lensing along with the gas sheath.

20 Claims, 4 Drawing Sheets

(56) References Cited

U.S. PATENT DOCUMENTS

| | | | |
|---|---|---|---|
| 10,800,098 B1* | 10/2020 | Mukhopadhyay | C04B 35/622 |
| 10,991,548 B2* | 4/2021 | Gandhiraman | H05H 1/246 |
| 2002/0100751 A1* | 8/2002 | Carr | H05H 1/30 |
| | | | 219/121.36 |
| 2003/0087530 A1* | 5/2003 | Carr | H01J 37/32376 |
| | | | 257/E21.243 |
| 2011/0095198 A1* | 4/2011 | Smiljanic | C23C 14/35 |
| | | | 250/492.1 |
| 2018/0250775 A1* | 9/2018 | Spink | B23K 26/034 |
| 2020/0051826 A1* | 2/2020 | Glukhoy | H01L 21/32137 |

OTHER PUBLICATIONS

Kalvas, T., "Beam Extraction and Transport," presented at the CERN Accelerator School CAS 2012: Ion Sources, Senec, May 29-Jun. 8, 2012, arXiv:1401.3951 [physics.acc-ph], 39 pages.

Zhu, P. et al., "Effect of external electric and magnetic field on propagation of atmospheric pressure plasma jet," Physics of Plasmas (2017) 24:103512, 7 pages.

\* cited by examiner

US 11,993,011 B1

PLASMA MICRONOZZLE ADAPTER

RELATED APPLICATIONS

This application claims priority to U.S. Provisional Application No. 62/969,249, filed on Feb. 3, 2020, and entitled PLASMA MICRONOZZLE ADAPTER, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a plasma micronozzle adapter capable of printing three dimensional (3D) elements having geometries as small as several microns using a commercial plasma jet printer.

BACKGROUND

Recent interest in flexible electronics and wearable devices has created a demand for fast and highly repeatable printing processes suitable for device manufacturing, including, for example, wearable devices for monitoring physiological conditions, patient care, environmental monitoring, and personal use. Various flexible substrates, such as paper and textile, have been considered for the fabrication and integration of components, including memory, sensors, energy storage devices, and others. Nanomaterials with semiconducting, dielectric, and/or metallic properties enable the implementation of various functions, for example, detection, information storage, signal transduction, and signal amplification. Thus, there is a demand for advanced printing technology that can print a wide range of materials on nontraditional substrates.

Printing nanomaterials on flexible substrates is a challenging task, and conventional methods such as physical vapor deposition, magnetron sputtering, plasma-enhanced chemical vapor deposition, photolithography, and chemical vapor deposition are not suitable for materials that cannot be processed under high vacuum, for example, due to outgassing issues. In addition, these are expensive techniques with significant capital equipment costs. Screen printing is an inexpensive process for planar substrates; however, the disadvantages include poor resolution, organic contaminants, and the need for thermal treatment. Recent alternatives include inkjet and aerosol printing, which also need post-deposition thermal treatment to form a uniform film and to remove organic contaminants. The removal step leads to void formation, which affects the film quality and subsequent device performance.

One solution to these various issues is atmospheric-pressure plasma jet deposition using a dielectric barrier discharge. The technique is scalable for high-throughput processing and amenable to coating three-dimensional objects. The presence of a dielectric material between the electrodes at the nozzle reduces the current filament, resulting in low temperature deposition suitable for low glass transition temperature materials. Hence, plasma jet printing technology holds potential for a broad range of applications in flexible electronics and wearable devices.

Atmospheric pressure plasma jet deposition systems have been used for polymer coatings wherein precursor monomers with low enthalpy of vaporization react with the oxygen in the gas phase to form a plasma polymerized coating. Atmospheric pressure plasma jet technology has also been employed for directional printing using the plasma and electric field.

One drawback of plasma jet printers is the rather large minimum width of the printed line. For example, Gandhiraman et al. demonstrated a minimum printed line width of 120-150 µm. See R. P. Gandhiraman et al., "Plasma Jet Printing of Electronic Materials on Flexible and Nonconformal Objects," Applied Materials & Interfaces, vol. 6, pp. 20860-20867 (2014), the contents of which are incorporated herein by reference. This minimum width is generally controlled by two fluid-like interactions that cause the plasma jet to disperse upon passing from the nozzle. First, both pressure and electrostatic gradients cause the ions in the plasma jet to disperse radially, and second, random particle collisions between the ions scatter the plume of the plasma jet. The combined actions of these two effects makes it difficult to achieve both small spot sizes and high print resolution.

As various applications require finer line widths, for example, less than 50 µm, the need exists for a plasma jet printer that can print these finer geometries and do so with a variety of inks used for printing.

SUMMARY

One aspect of the present invention relates to a plasma micro nozzle adapter. This plasma micro nozzle adapter design improves existing commercial 3D plasma jet printer performance by approximately 10-fold to enable smaller printed features, including, for example, high-density chip copper interconnects. While current print line width and thickness are both typically limited to 150-200 µm, the plasma micro nozzle adapter will enable a line width of 10-15 µm.

To address the problem of low resolution, 3D printed copper traces, at least one embodiment of the present invention, includes a novel plasma micro nozzle adapter. The plasma jet enables a wide range of materials to be printed on the same platform, including ceramics for IC packages, metals for integrated conductors, insulators to protect and isolate integrated conductors, and plastics for encapsulation. This plasma micro nozzle adapter may be formed using a hybrid combination of silicon-on-insulator (SOI) wafer technology, microfabrication techniques (thin metallic and dielectric films, photopatterning, etch, etc.), and other additive or subtractive manufacturing techniques such as metal electroforming and etching. In some cases, even the 3D plasma jet printer itself may be used to create the various sub-elements that comprise the plasma micro nozzle adapter. In certain embodiments of the present invention, termination elements, such as electrostatic, low frequency RF (20-300 kHz) or magnetostatic-based elements, will be incorporated along with a micromachined plasma orifice to focus the plasma beam and tune the deposition spot size. In other embodiments of the present invention, a gas sheath will be employed to focus and tune the plasma beam and deposition spot size.

In a first class of embodiments of the present invention, a plasma micro nozzle adapter comprises a body (the body having a plasma orifice therethrough, the plasma orifice defining a central plasma axis), one or more lensing electrodes (each lensing electrode located internal and/or external to the body), and one or more termination elements (each termination element lensing a plasma jet using electrostatic or magnetostatic lensing, each termination element electrically connected to the one or more lensing electrodes).

In various embodiments of the present invention, each termination element comprises a coaxial ring (the coaxial ring located coaxially about the central plasma axis) or a central metal plate (the central metal plate including an aperture therethrough coincident with the central plasma axis); the one or more termination elements include two or more electrodes (the two or more electrodes spaced angularly symmetrically about the central plasma axis); each termination element comprises a linear coil (a central axis of the linear coil coincident with the central plasma axis) or a toroidal coil (a central axis of the toroidal coil coincident with the central plasma axis); and the one or more termination elements include two or more electromagnetic poles (the two or more electromagnetic poles spaced angularly symmetrically about the central plasma axis).

In other embodiments of the present invention, the body comprises a ceramic or a dielectric; each lensing electrode comprises gold, silver, or copper; and the plasma micro nozzle adapter is formed, at least in part, by an additive manufacturing process or a subtractive manufacturing process.

In a second class of embodiments of the present invention, a plasma micro nozzle adapter comprises a body (the body including a plasma orifice therethrough, the plasma orifice defining a central plasma axis, the body having a ring-shaped exit orifice, the ring-shaped exit orifice concentric to the plasma orifice, the body further including at least one microfluidic channel, each microfluidic channel in fluid connection with the ring-shaped exit orifice) and at least one sheath gas port (each sheath gas port located adjacent to an exterior surface of the body, each sheath gas port in fluid connection with the ring-shaped exit orifice via the at least one microfluidic channel).

In various embodiments of the present invention, the ring-shaped exit orifice comprises a continuous ring, a plurality of arc-shaped orifices, or a plurality of orifices; and the ring-shaped exit orifice comprises a plurality of arc-shaped orifices or a plurality of orifices, the at least one sheath gas port comprises two sheath gas ports, the plasma micro nozzle adapter controls a cross-sectional shape of a plasma jet, and the cross-sectional shape of the plasma jet need not be circular.

In other embodiments of the present invention, the plasma micro nozzle adapter further comprises at least one valve (each valve in fluid connection with a corresponding one of the sheath gas ports, each valve controlling a flow or a pressure of a gas passing therethrough); and the at least one sheath gas port comprises two sheath gas ports, the at least one valve comprises two valves, the ring-shaped exit orifice comprises a plurality of arc-shaped orifices or a plurality of orifices, the two valves controlling a cross-sectional shape of a plasma jet, and the cross-sectional shape of the plasma jet need not be circular.

In still other embodiments of the present invention, the body comprises a ceramic or a dielectric; and the plasma micro nozzle adapter is formed, at least in part, by an additive manufacturing process or a subtractive manufacturing process.

In a third class of embodiments of the present invention, a plasma micro nozzle adapter comprises a body (the body including a plasma orifice therethrough, the plasma orifice defining a central plasma axis, the body having a ring-shaped exit orifice, the ring-shaped exit orifice concentric to the plasma orifice, the body further including at least one microfluidic channel, each microfluidic channel in fluid connection with the ring-shaped exit orifice), one or more lensing electrodes (each lensing electrode located internal and/or external to the body), one or more termination elements (each termination element lensing a plasma jet using electrostatic or magnetostatic lensing, each termination element electrically connected to the one or more lensing electrodes), and at least one sheath gas port (each sheath gas port located adjacent to an exterior surface of the body, each sheath gas port in fluid connection with the ring-shaped exit orifice via the at least one microfluidic channel).

In various embodiments of the present invention, each of the termination elements comprises a coaxial ring (each coaxial ring located coaxially about the central plasma axis) or a central metal plate (the central metal plate including an aperture therethrough coincident with the central plasma axis); each of the termination elements comprises a linear coil (a central axis of the linear coil being coincident with the central plasma axis) or a toroidal coil (a central axis of the toroidal coil being coincident with the central plasma axis); and the ring-shaped exit orifice comprises a plurality of arc-shaped orifices or a plurality of orifices, the at least one sheath gas port comprises two sheath gas ports, the plasma micro nozzle controlling a cross-sectional shape of a plasma jet, and the cross-sectional shape of the plasma jet need not be circular.

In other embodiments of the present invention, the body comprises a ceramic or a dielectric, and each lensing electrode comprises gold, silver, or copper.

Features from any of the disclosed embodiments may be used in combination with one another, without limitation. In addition, other features and advantages of the present disclosure will become apparent to those of ordinary skill in the art through consideration of the following detailed description and the accompanying drawings.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
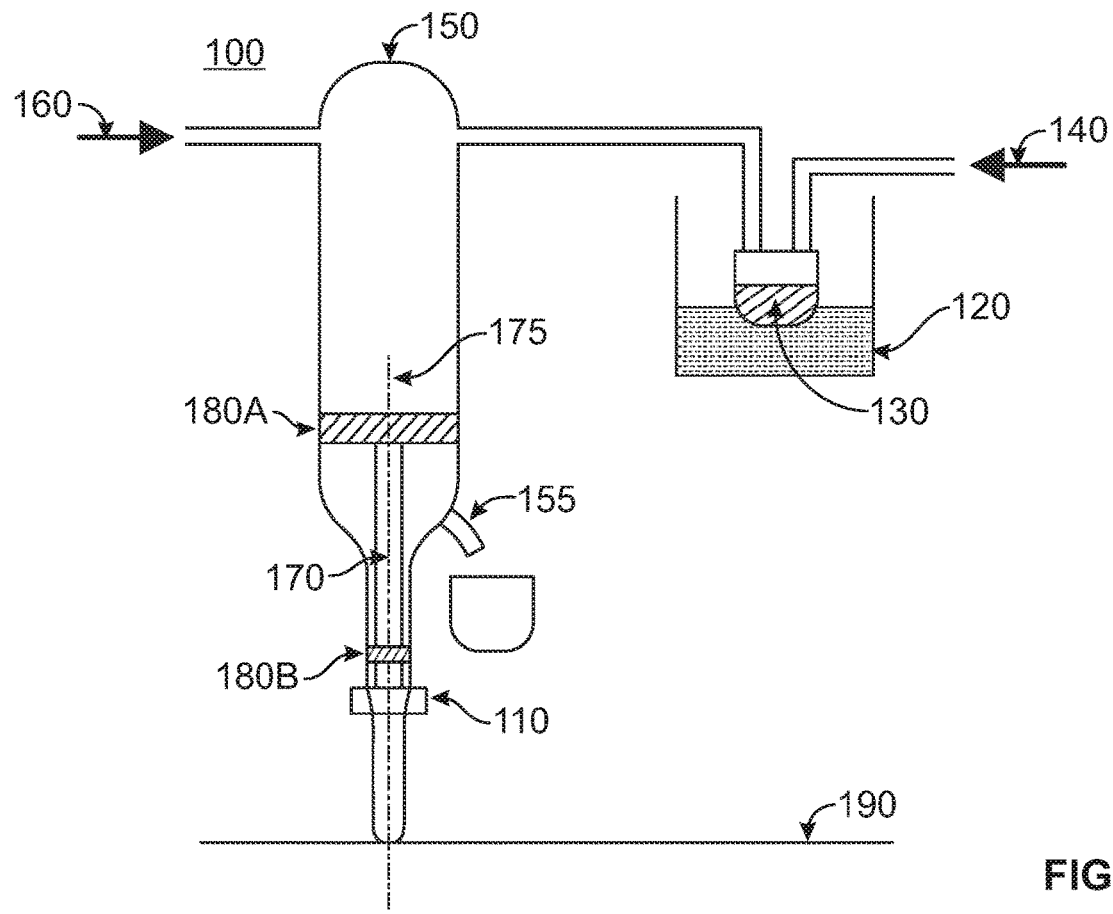
FIG. 1 illustrates an exemplary plasma jet printer to which a plasma micro nozzle adapter in accordance with one or more embodiments of the present invention is attached.

FIG. 1 illustrates an exemplary commercial plasma jet printer 100 to which an embodiment of the present invention, i.e., a plasma micro nozzle adapter 110 is attached. The plasma jet printer 100 includes a nebulizer 120 for aerosolizing the desired ink 130. The aerosolized ink 130 is transported by a carrier gas 140. The aerosolized ink 130 enters the plasma chamber 150, where its pressure is controlled by a pressure gas 160. The aerosolized ink 130 becomes a plasma jet 170 as it passes between a pair of plasma electrodes 180A, 180B, with the plasma jet 170 defining a central plasma axis 175. As a portion of the aerosolized ink 130 may condense on the inner surface of the plasma chamber 150, a drain 155 may optionally be included to drain away this condensed ink. After formation of the plasma jet 170, the plasma jet 170 passes through the plasma micro nozzle adapter 110 for final control of the plasma jet 170 to create the desired small spot size and corresponding narrow line width on the printing surface 190.

The nebulizer 120 may be implemented in any suitable manner that creates the desired aerosolized ink 130. The nebulizer 120 may, for example, take the form of a jet nebulizer in which a stream of a carrier gas 140 is forced through the ink. The nebulizer may alternatively employ ultrasonic waves to create a vapor mist of the ink that is subsequently transported by the carrier gas 140. The nebulizer may also alternatively employ a vibrating mesh on the surface of the ink that again generates a vapor mist that is subsequently transported by the carrier gas 140. In yet other embodiments, the nebulizer may employ heat to evaporate the ink, thereby generating a vapor mist that is subsequently transported by the carrier gas 140. The carrier gas 140 may depend upon the composition of the ink, but is preferably He, Hz, or Ar.

The ink may have any composition consistent with the desired printed material. Copper-, silver-, or gold-bearing inks may be employed when the desired printed material is to form, for example, electrically conductive traces. Carbon-based graphene and graphene oxide have also been demonstrated to form electrically conductive traces. A dielectric layer may be formed, for example, using tetraethyl orthosilicate (TEOS). Ceramic material, for example, alumina and zirconia, may be printed using aluminum- and zirconium-containing inks, respectively. Plastic material may be printed using various monomer- or polymer-containing inks.

The plasma chamber 150 may be formed of any suitable material, though a quartz tube is employed in the preferred embodiment. The plasma chamber 150 may have any suitable dimensions, though a diameter of 5-10 mm and a length of 50-100 mm is preferable.

The pressure gas 160 may be any suitable gas given the composition of the ink, but is preferably He or Hz, or some mixture thereof.

The pair of plasma electrodes 180A, 180B may be formed of any suitable material and formed in any suitable manner. In a preferred embodiment, the plasma electrodes 180A, 180B are formed of copper foil or tape and separated by 10-30 mm. The plasma electrodes 180A, 180B are driven by a high voltage AC source operating at 10-50 kHz and 1-15 kV.

As will be appreciated by those of ordinary skill in the art, the narrowest line width will be achieved when the focus of the plasma jet 170 is located at approximately the printing surface 190. If multiple different line widths are required for a given application, this can readily be achieved by moving the location of the focus. In other words, by defocusing the plasma jet 170 relative to the printing surface 190, different line widths can readily be achieved.

To improve the properties of the printed line, for example, its conductivity, one may pass the plasma jet 170 over the printed line a second time, but without supplying aerosolized ink 130 to the plasma jet 170. This second pass of the plasma jet 170 over the printed line may serve to reduce (or further reduce) the composition of the printed line by removing oxygen from the material forming the printed line. This second pass of the plasma jet 170 avoids the drawbacks of various prior art reducing techniques such as high-temperature annealing, the use of reducing agents such as hydrazine vapor, or exposure to high intensity ultraviolet (UV) radiation.

Figure 2:
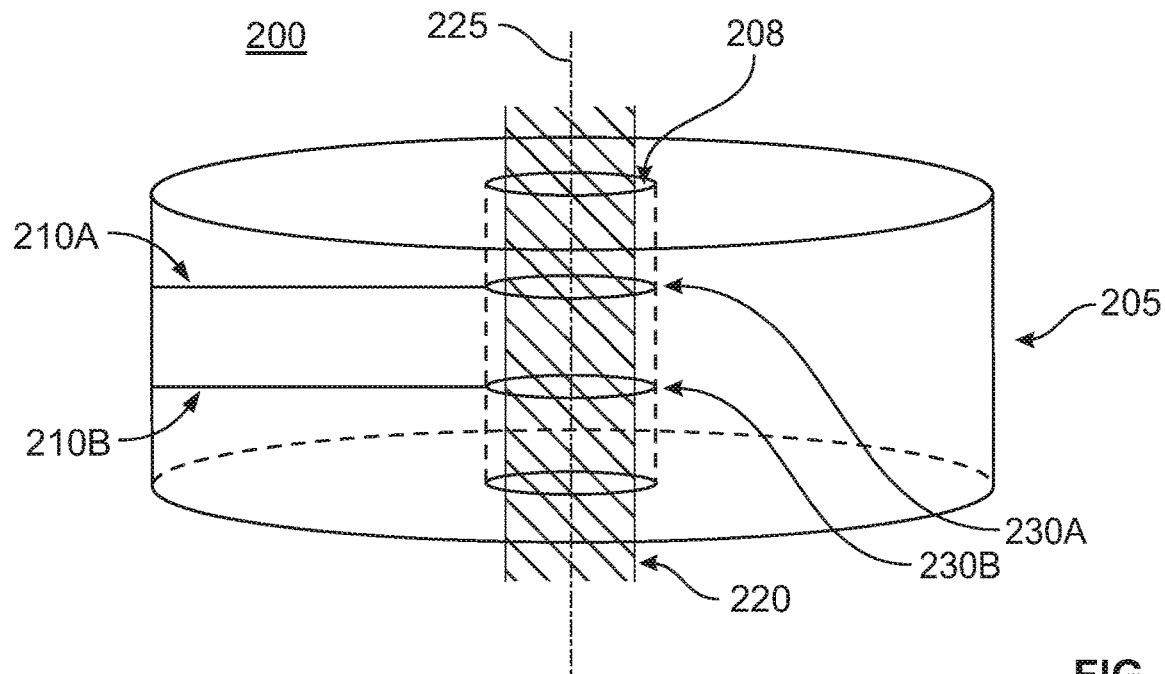
FIG. 2 illustrates an electrostatic-based plasma micro nozzle adapter in accordance with one or more embodiments of the present invention.

In a first class of embodiments of the present invention, the plasma micro nozzle adapter 200, illustrated in FIG. 2, includes a body 205 having a plasma orifice 208 therethrough, and a pair of lensing electrodes 210A, 210B. A plasma jet 220 passes along a central plasma axis 225 defined by the plasma orifice 208. The lensing electrodes 210A, 210B may be employed to generate electrostatic lensing or magnetostatic lensing depending upon the termination element(s) electrically connected to the lensing electrodes 210A, 210B.

In certain embodiments of the present invention, the termination elements are coaxial rings 230A, 230B, as shown in FIG. 2, with the coaxial rings 230A, 230B located coaxially about the central plasma axis 225 of the plasma jet 220 and separated in a direction along the central plasma axis 225. Due to the micro dimensions of the plasma micro nozzle adapter 200, the biases applied to the lensing electrodes 210A, 210B when employing coaxial rings 230A, 230B can be much smaller than the biases required to initially create the plasma jet 220. As will be appreciated by those of ordinary skill in the art, a third coaxial ring (not illustrated) may be employed to create an einzel lens. While the einzel lens has the added complexity of a third coaxial ring, it also provides the benefit of more accurately controlling the degree of focusing and the location of the focus for the plasma jet 220. The focusing generated by the coaxial rings 230A, 230B is of the electrostatic type.

In yet another alternative embodiment, a single coaxial ring is employed. The single coaxial ring embodiment operates with a single bias, relying on the ground electrode of the pair of plasma electrodes 180A, 180B and a ground plane (not illustrated) located below the printing surface 190 (or simply grounding the printing surface 190 where feasible) to create the desired electric fields. In a still further embodiment employing a single coaxial ring, the single coaxial ring is allowed to float. See P. Zhu et al., "Effect of external electric and magnetic field on propagation of atmospheric pressure plasma jet," Physics of Plasmas, vol. 24, doc. no. 103512 (2017), the contents of which are incorporated herein by reference, for a discussion of using a single coaxial ring.

Figure 3:
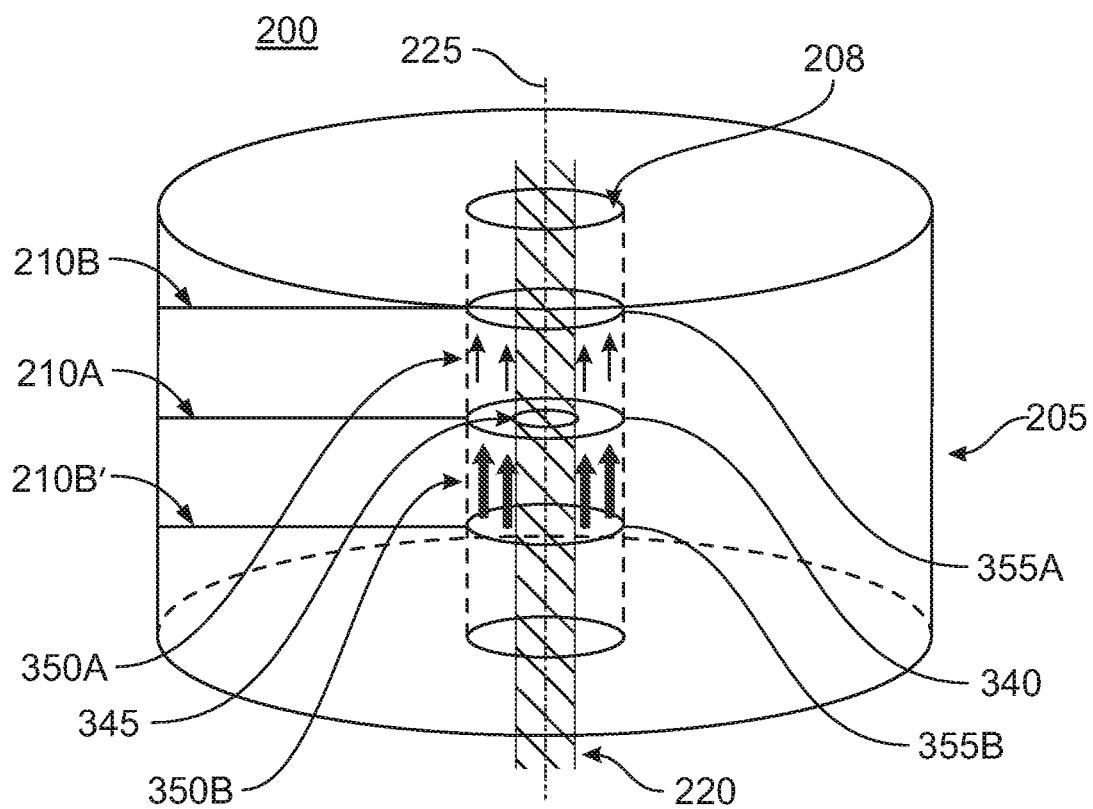
FIG. 3 illustrates an electrostatic-based plasma micro nozzle adapter in accordance with one or more embodiments of the present invention.

FIG. 3 illustrates a second electrostatic lensing configuration, typically termed an aperture lens. In this configuration, the termination element is a central metal plate 340 with an aperture 345 coincident with the central plasma axis 225 of the plasma jet 220. The central metal plate 340 separates two different longitudinal electric fields 350A, 350B having different field strengths. The two different longitudinal electric fields 350A, 350B can be created using coaxial rings 355A, 355B located on either side of the central metal plate 340 in a direction along the central plasma axis 225. When the second electric field 350B is greater than the first electric field 350A, the aperture lens is a focusing lens, as desired for the present invention. As with the einzel lens, the degree of focusing and the location of the focus can be controlled by the magnitudes of the first and second electric fields 350A, 350B.

In yet another alternative embodiment, the coaxial rings 355A, 355B are not employed. This central metal plate 340 only embodiment operates with a single bias, relying on the ground electrode of the pair of plasma electrodes 180A, 180B and a ground plane (not illustrated) located below the printing surface 190 to create the desired first and second electric fields 350A, 350B.

While the foregoing embodiments have each employed a configuration in which the focusing field is angularly symmetrical about the central plasma axis 225, this need not be the case. For example, an electrostatic quadrupole lens may be formed about the central plasma axis 225 with four, typically hyperbolic, electrodes 465A-465D placed angularly symmetrically about the central plasma axis 225. By applying a positive potential $+V_{quad}$ on the +x and −x electrodes 465A, 465C and a negative potential $-V_{quad}$ on the +y and −y electrodes 465B, 465D, the resulting plasma jet 220 can be focused in one direction and defocused in the orthogonal direction, thereby producing a plasma jet 220 having an elliptical cross-sectional shape. See T. Kalvas, "Beam Extraction and Transport," Proceedings of CERN Accelerator School, Ion Sources, pp. 537-564 (2012), the contents of which are incorporated herein by reference, for a discussion of both electrostatic and magnetostatic quadrupole lenses. While the illustrated embodiment employs a quadrupole lens, lower or higher order lenses, such as dipole, hexapole, and octupole lenses, may be employed in other embodiments.

Figure 5:
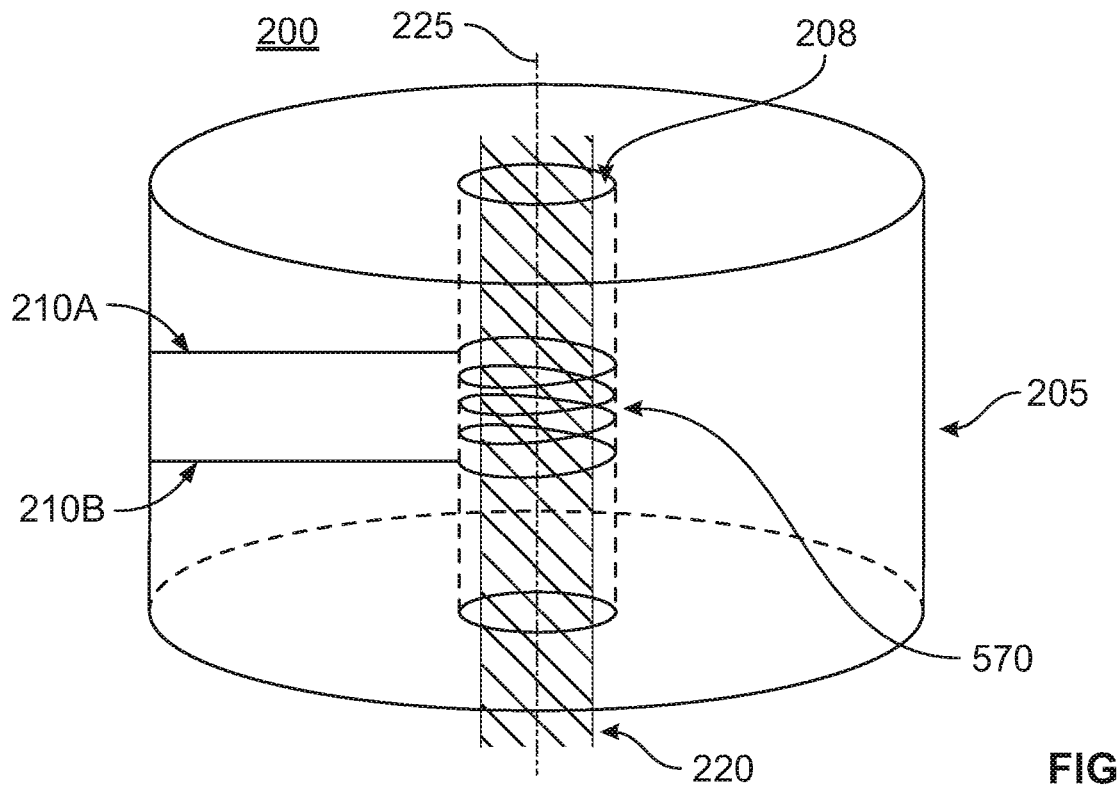
FIG. 5 illustrates a magnetostatic-based plasma micro nozzle adapter in accordance with one or more embodiments of the present invention.

FIG. 5 illustrates an embodiment employing magnetostatic lensing, in which the termination element is a linear coil 570 whose central axis is coincident with the central plasma axis 225 of the plasma jet 220. The linear coil 570, with its coincident axis, is known as a solenoidal magnetic lens. The solenoidal magnetic lens can control the degree of focusing and the location of the focus by controlling the magnitude of the magnetic field, i.e., through control of the current applied to the lensing electrodes 210A, 210B and which flows through the linear coil 570, creating the magnetic field.

Figure 6:
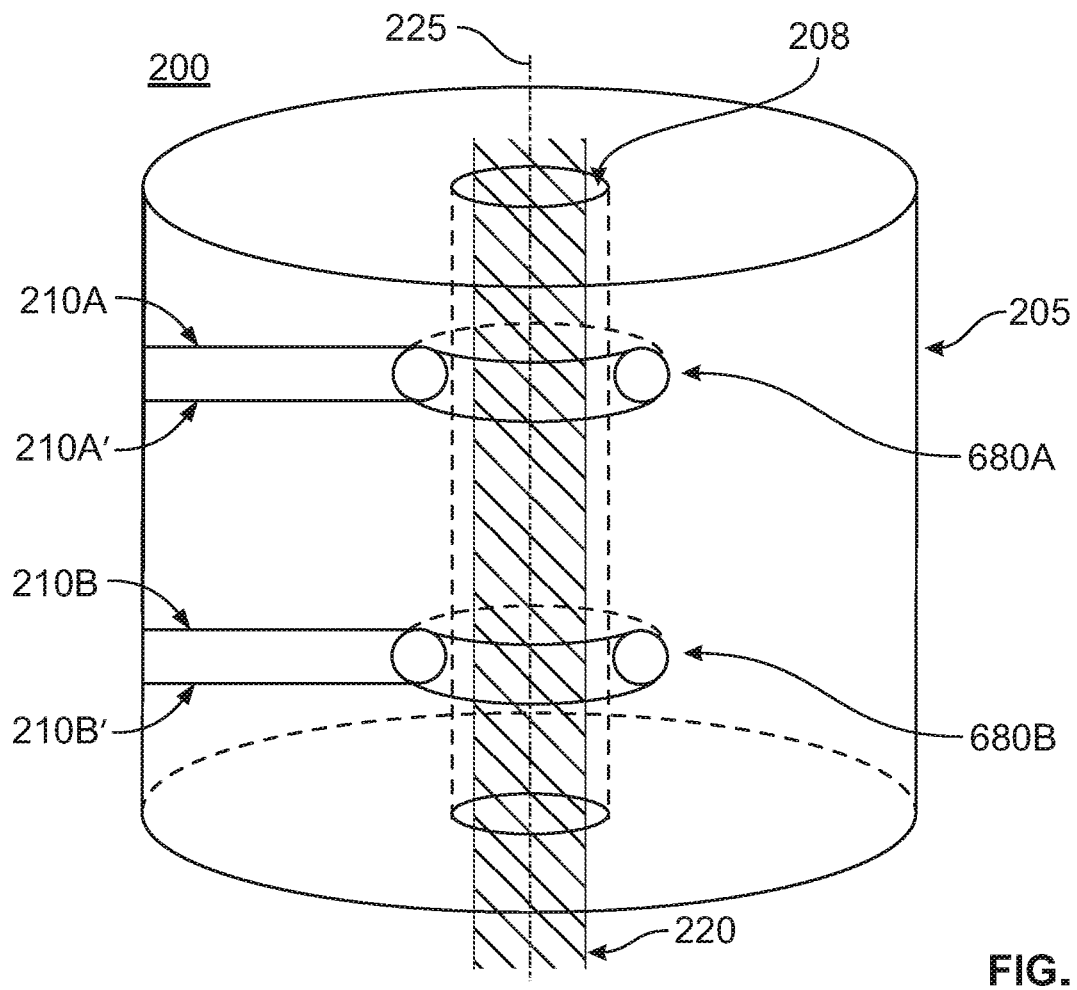
FIG. 6 illustrates a magnetostatic-based plasma micro nozzle adapter in accordance with one or more embodiments of the present invention.

FIG. 6 illustrates another embodiment employing magnetostatic lensing, in which the termination element is a pair of toroidal coils 680A, 680B whose central axes are coincident with the central plasma axis 225 of the plasma jet 220. If the currents flowing through the toroidal coils 680A, 680B are such that the first toroidal coil 680A causes the plasma jet 220 to diverge and the second toroidal coil 680B causes the plasma 220 to converge, the pair of toroidal coils 680A, 680B can be used to control the degree of focusing and the location of the focus by controlling the magnitudes of the corresponding magnetic fields, i.e., through control of the applied currents creating the magnetic fields. Certain embodiments of the present invention employ a third toroidal coil (not illustrated) to more accurately control the degree of focusing and the location of the focus.

Figure 4:
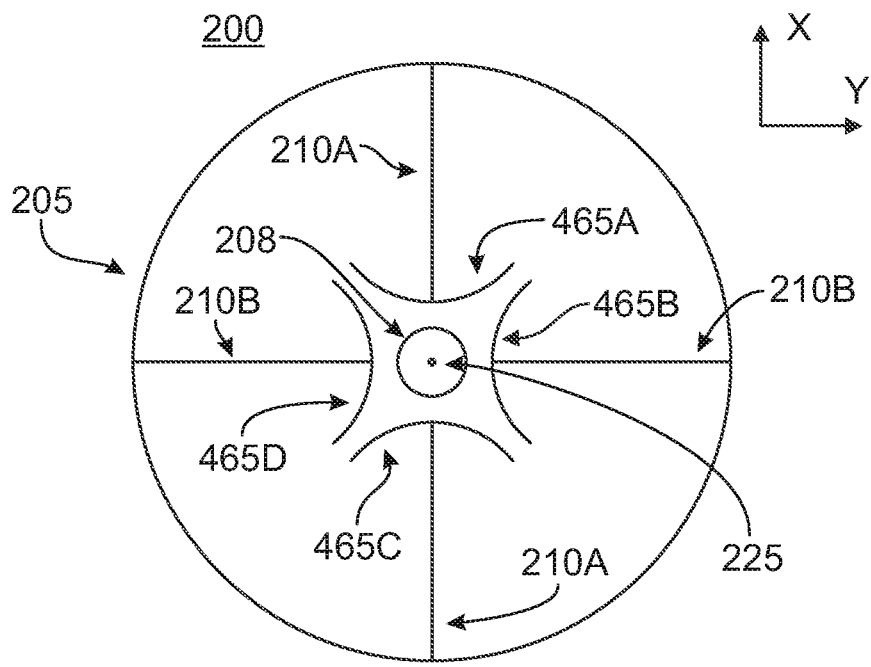
FIG. 4 illustrates an electrostatic-based plasma micro nozzle adapter in accordance with one or more embodiments of the present invention.

As will be appreciated by those of ordinary skill in the art, a magnetostatic quadrupole lens, the magnetic analog of the electrostatic quadrupole lens illustrated in FIG. 4, is possible. In this embodiment, a series of four electromagnetic poles would be placed angularly symmetrically about the central plasma axis 225. The windings on the four electromagnetic poles are alternated such that the resultant magnetic flux is into or out of the plasma jet 220. These alternating magnetic fluxes focus the plasma jet 220 in one direction and defocus the plasma jet 220 in the orthogonal direction, thereby producing a plasma jet 220 having an elliptical cross-sectional shape. As with the electrostatic quadrupole lens illustrated in FIG. 4, the magnetostatic lens may alternatively be a lower or higher order lens, such as a dipole, a hexapole, or an octupole lens. Other embodiments may employ permanent magnets, though such embodiments will not have the focusing flexibility provided by the electromagnet embodiment.

The body 205 of the plasma micro nozzle adapter 200 may be formed of any suitable material and formed in any suitable manner. The body 205 may, for example, be formed of a ceramic, such as alumina, or a dielectric, such as silicon dioxide or silicon nitride. The plasma micro nozzle adapter 200 may, for example, be formed by an additive manufacturing (AM) process, a subtractive manufacturing (SM) process, or by a combination of AM and SM processes.

The conducting elements, including the lensing electrodes 210A, 210B, the coaxial rings 230A, 230B, the central metal plate 340, the coaxial rings 355A, 355B, the electrodes 465A-465D, the linear coil 570, the pair of toroidal coils 680A, 680B, and the electromagnetic poles may be formed of any suitable material and formed in any suitable manner. These conducting elements may, for example, be formed of various metals, such as gold, silver, and/or copper. These conducting elements may, for example, be formed by an AM process, a SM process, or by a combination of AM and SM processes. The various embodiments of the plasma micro nozzle adapter 200 illustrated in FIGS. 2-6 show the conducting elements are located internal to the plasma micro nozzle adapter 200. In other embodiments of the present invention, some or all of the conducting elements may be located on an external surface of the plasma micro nozzle adapter 200. In still other embodiments of the present invention, a first portion of a given conducting element may be located internal to the plasma micro nozzle adapter 200, while a second portion of the given conducting element may be located on an external surface of the plasma micro nozzle adapter 200, for example, to facilitate connection to the electronics (not illustrated) used to drive the plasma micro nozzle adapter 200.

Figure 7A:
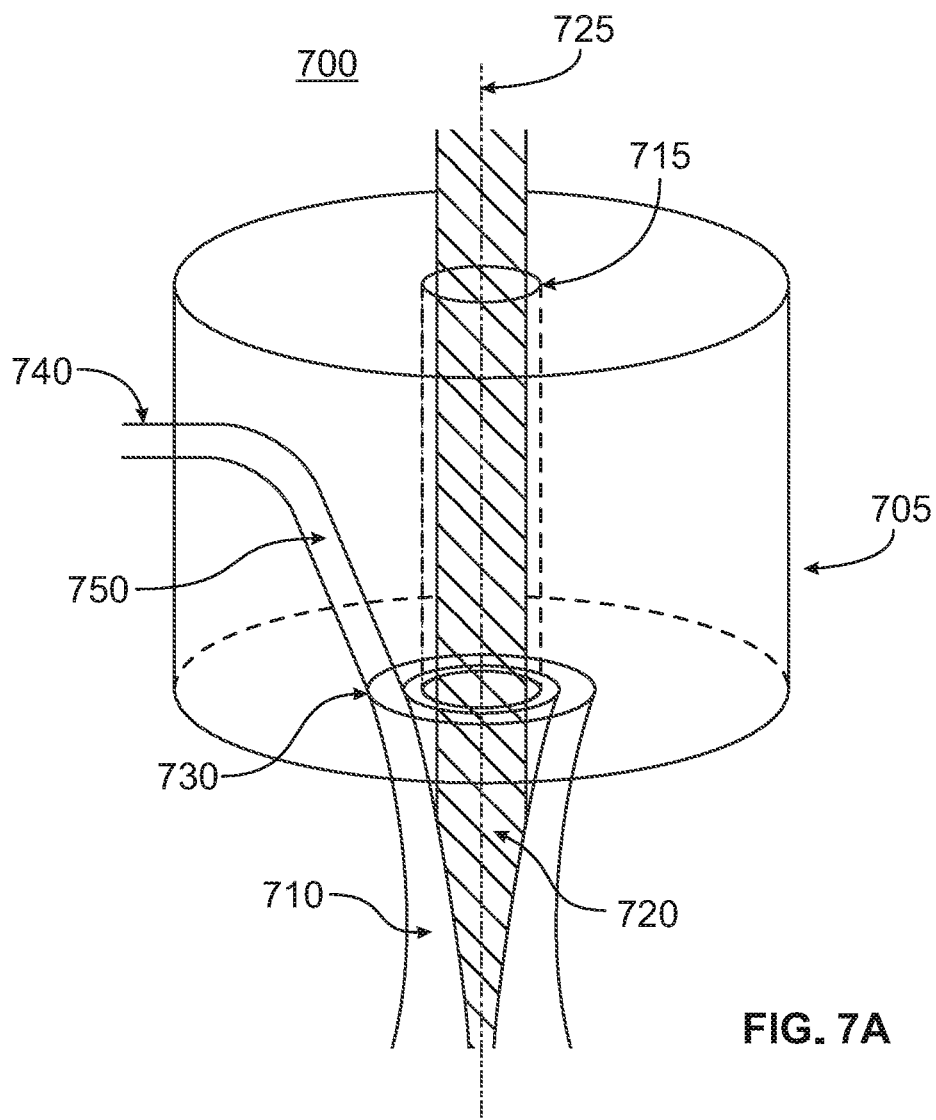
FIGS. 7A-7D illustrate a gas sheath-based plasma micro nozzle adapter in accordance with various embodiments of the present invention.

In a second class of embodiments of the present invention, the plasma micro nozzle adapter 700, illustrated in FIG. 7A, employs a gas sheath 710. This gas sheath 710 surrounds the plasma jet 720 as the plasma jet 720 exits the body 705. The gas sheath 710 is formed by a ring-shaped exit orifice 730 that is concentric to a plasma orifice 715 that defines a central plasma axis 725 of the plasma jet 720, with the plasma orifice 715 being internal to the plasma micro nozzle 700. The gas used to form the gas sheath 710 is supplied to the plasma micro nozzle 700 via a sheath gas port 740 located adjacent to an exterior surface of the body 705, with one or more microfluidic channels 750 fluidly connecting the sheath gas port 740 to the ring-shaped exit orifice 730. By altering the flow rate and/or the pressure of the gas used to form the gas sheath 710, the shape of the plasma jet 720, and thus the resultant line width, can readily be varied should multiple different line widths be required for a given application.

The body 705 of the plasma micro nozzle adapter 700 may be formed of any suitable material and formed in any suitable manner. The body 705 may, for example, be formed of a ceramic, such as alumina, or a dielectric, such as silicon dioxide or silicon nitride. The plasma micro nozzle adapter 700 may, for example, be formed by an AM process, a SM process, or by a combination of AM and SM processes.

The gas used to form the gas sheath 710 may be any suitable gas at any suitable flow rate and/or pressure. The gas may, for example, be He, Hz, Ar, or some mixture thereof.

Figures 7B, 7C, 7D:
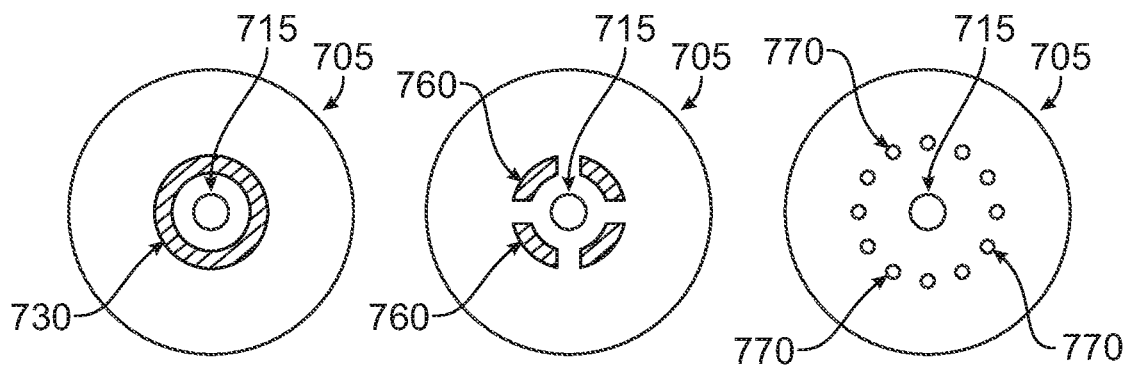

While the ring-shaped exit orifice 730 is illustrated as a single orifice, in other embodiments of the present invention it may be implemented as a plurality of arc-shaped orifices 760 forming a ring or a plurality of orifices 770 forming a ring that are concentric to the central plasma axis 725 of the plasma jet 720 and internal to the plasma micro nozzle adapter 700. The configurations of the ring-shaped exit orifice 730, the plurality of arc-shaped orifices 760, and the plurality of orifices 770 are shown in end-on views of the body 705 in FIGS. 7B-7D, respectively. In yet other embodiments of the present invention, the plurality of arc-shaped or orifices may be supplied by a plurality of sheath gas ports 740, each sheath gas port 740 having its own flow rate and/or pressure. In this manner, the cross-sectional shape of the plasma jet 720 can be controlled and need not be circular. For example, a shaped plasma jet 720 having an elliptical cross-sectional shape can be formed, resulting in different printed line widths in two orthogonal directions. This may allow the writing of a thicker printed line if the plasma jet 720 is moved in a direction parallel to the long axis of the elliptical cross-sectional shape without requiring multiple passes of the plasma jet 720.

While the illustrated plasma micro nozzle adapter 700 does not include a valve to control the flow of the gas used to form the gas sheath 710, other embodiments of the present invention may include such a control valve, for example, as part of the sheath gas port 740 or in the one or more microfluidic channels 750. This control valve may be formed of a MEMS element. Yet other embodiments of the present invention may include two or more control valves to allow altering of the cross-sectional shape of the plasma jet 720 when the plasma micro nozzle adapter 700 has a plurality of arc-shaped orifices 760 or orifices 770.

In certain embodiments of the present invention, electrostatic lensing (or magnetostatic lensing) may be used in combination with a gas sheath in a single plasma micro nozzle adapter. This combination provides even greater control over the line shape and line width printed by the plasma jet printer 100.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A plasma micro nozzle adapter comprising:
a body having a plasma orifice therethrough, the plasma orifice defining a central plasma axis;
one or more lensing electrodes, each of the one or more lensing electrodes being located one or more of internal and external to the body; and
one or more termination elements, the one or more termination elements adapted to lens a plasma jet using electrostatic lensing or magnetostatic lensing, the one or more termination elements being electrically connected to the one or more lensing electrodes.

2. The plasma micro nozzle adapter of claim 1,
wherein each of the one or more termination elements comprises a coaxial ring or a central metal plate;
wherein each coaxial ring is located coaxially about the central plasma axis; and
wherein each central metal plate includes an aperture therethrough, each respective aperture being coincident with the central plasma axis.

3. The plasma micro nozzle adapter of claim 1, wherein the one or more termination elements comprise two or more electrodes, the two or more electrodes spaced angularly symmetrically about the central plasma axis.

4. The plasma micro nozzle adapter of claim 1,
wherein each of the one or more termination elements comprises a linear coil or a toroidal coil;
wherein a central axis of each linear coil is coincident with the central plasma axis; and
wherein a central axis of each toroidal coil is coincident with the central plasma axis.

5. The plasma micro nozzle adapter of claim 1, wherein the one or more termination elements comprise two or more electromagnetic poles, the two or more electromagnetic poles spaced angularly symmetrically about the central plasma axis.

6. The plasma micro nozzle adapter of claim 1, wherein the body comprises a ceramic or a dielectric.

7. The plasma micro nozzle adapter of claim 1, wherein each of the one or more lensing electrodes comprises at least one of gold, silver, or copper.

8. The plasma micro nozzle adapter of claim 1, wherein the plasma micro nozzle adapter is formed, at least in part, by an additive manufacturing process or a subtractive manufacturing process.

9. A plasma micro nozzle adapter comprising:
a body including a plasma orifice therethrough, the plasma orifice defining a central plasma axis, the body having a ring-shaped exit orifice, the ring-shaped exit orifice being concentric to the plasma orifice, the body further including at least one microfluidic channel, each of the at least one microfluidic channels in fluid connection with the ring-shaped exit orifice; and
at least one sheath gas port, each of the at least one sheath gas ports being located adjacent to an exterior surface of the body, each of the at least one sheath gas ports in fluid connection with the ring-shaped exit orifice via the at least one microfluidic channel.

10. The plasma micro nozzle adapter of claim 9, wherein the ring-shaped exit orifice comprises at least one selected from the group of a continuous ring, a plurality of arc-shaped orifices, a plurality of orifices, and combinations thereof.

11. The plasma micro nozzle adapter of claim 9,
wherein the ring-shaped exit orifice comprises a plurality of arc-shaped orifices forming a ring or a plurality of orifices forming a ring;
wherein the at least one sheath gas port comprises two sheath gas ports;
wherein the plasma micro nozzle adapter is adapted to control a cross-sectional shape of a plasma jet; and
wherein the cross-sectional shape of the plasma jet need not be circular.

12. The plasma micro nozzle adapter of claim 9 further comprising at least one valve, each of the at least one valves in fluid connection with a corresponding one of the at least one sheath gas ports, each of the at least one valves adapted to control a flow or a pressure of a gas passing therethrough.

13. The plasma micro nozzle adapter of claim 12,
wherein the at least one sheath gas port comprises two sheath gas ports;
wherein the at least one valve comprises two valves;
wherein the ring-shaped exit orifice comprises a plurality of arc-shaped orifices forming a ring or a plurality of orifices forming a ring;
wherein the two valves are adapted to control a cross-sectional shape of a plasma jet; and
wherein the cross-sectional shape of the plasma jet need not be circular.

14. The plasma micro nozzle adapter of claim 9, wherein the body comprises a ceramic or a dielectric.

15. The plasma micro nozzle adapter of claim 9, wherein the plasma micro nozzle adapter is formed, at least in part, by an additive manufacturing process or a subtractive manufacturing process.

16. A plasma micro nozzle adapter comprising:
a body including a plasma orifice therethrough, the plasma orifice defining a central plasma axis, the body having a ring-shaped exit orifice, the ring-shaped exit orifice being concentric to the plasma orifice, the body further including at least one microfluidic channel, each of the at least one microfluidic channels in fluid connection with the ring-shaped exit orifice;
one or more lensing electrodes, each of the one or more lensing electrodes being located one or more of internal and external to the body;
one or more termination elements, the one or more termination elements adapted to lens a plasma jet using electrostatic lensing or magnetostatic lensing, the one or more termination elements being electrically connected to the one or more lensing electrodes; and
at least one sheath gas port, each of the at least one sheath gas ports located adjacent to an exterior surface of the body, each of the at least one sheath gas ports in fluid connection with the ring-shaped exit orifice via the at least one microfluidic channel.

17. The plasma micro nozzle adapter of claim 16,
wherein each of the one or more termination elements comprises a coaxial ring or a central metal plate;
wherein each coaxial ring is located coaxially about the central plasma axis; and
wherein each central metal plate includes an aperture therethrough, each respective aperture being coincident with the central plasma axis.

18. The plasma micro nozzle adapter of claim 16,
wherein each of the one or more termination elements comprises a linear coil or a toroidal coil;
wherein a central axis of each linear coil is coincident with the central plasma axis; and
wherein a central axis of each toroidal coil is coincident with the central plasma axis.

19. The plasma micro nozzle adapter of claim 16,
wherein the ring-shaped exit orifice comprises at least one selected from the group of a continuous ring, a plurality of arc-shaped orifices, a plurality of orifices, and combinations thereof;
wherein the at least one sheath gas port comprises two sheath gas ports;
wherein the plasma micro nozzle is adapted to control a cross-sectional shape of a plasma jet; and
wherein the cross-sectional shape of the plasma jet need not be circular.

20. The plasma micro nozzle adapter of claim 16,
wherein the body comprises a ceramic or a dielectric; and
wherein the one or more lensing electrodes comprises at least one of gold, silver, or copper.

\* \* \* \* \*